United States Patent
Choi et al.

(10) Patent No.: US 11,476,837 B2
(45) Date of Patent: Oct. 18, 2022

(54) ACTIVE MATCHING NETWORK DESIGN FOR ELECTRICALLY SMALL RESONANT ANTENNAS

(71) Applicant: U.S. Army Combat Capabilities Development Command, Army Research Laboratory, Adelphi, MD (US)

(72) Inventors: Jihun Choi, Silver Spring, MD (US); Fikadu T. Dagefu, Silver Spring, MD (US); Brian M. Sadler, Laurel, MD (US); Kamal Sarabandi, Ann Arbor, MI (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/895,490

(22) Filed: Jun. 8, 2020

(65) Prior Publication Data
US 2021/0028770 A1    Jan. 28, 2021

Related U.S. Application Data

(60) Provisional application No. 62/873,240, filed on Jul. 12, 2019.

(51) Int. Cl.
*H01Q 9/04* (2006.01)
*H03H 11/28* (2006.01)

(52) U.S. Cl.
CPC .............. *H03H 11/28* (2013.01); *H01Q 9/04* (2013.01)

(58) Field of Classification Search
CPC .......... H01Q 1/22; H01Q 1/2291; H01Q 1/24; H01Q 1/241; H01Q 9/04; H01Q 23/00; H03H 7/38; H03H 9/545; H03H 11/28; H03H 11/30; H03H 11/44; H03F 3/45165
See application file for complete search history.

(56) References Cited

U.S. PATENT DOCUMENTS 3,521,169 A * 7/1970 Lindenmeier .......... H01Q 23/00
455/129
10,469,039 B2 * 11/2019 Lee ......................... H03F 3/193
(Continued)

OTHER PUBLICATIONS

Wheeler, "Fundamental Limitations of Small Antennas", IEEE, Proceedings of The I.R.E., 1947, p. 1479-1484, Dec. 1947.
(Continued)

*Primary Examiner* — Thai Pham
(74) *Attorney, Agent, or Firm* — Christos S. Kyriakou (57) ABSTRACT

An active matching network for impedance matching to a miniature antenna, comprising a cross-coupled transistor pair, where each transistor has an emitter, base and collector, the emitter of a first transistor forms an input terminal, the emitter of a second transistor forms on output terminal, the collector of the first transistor coupled to the base of the second transistor, the collector of the second transistor coupled to the base of the first transistor, and a matching circuit coupled between the collectors of the first and second transistors. The matching network is configured to match an impendence near resonance of the high Q miniature antenna to an input impedance using a complex negative impedance comprising resistance, inductance and capacitance.

12 Claims, 6 Drawing Sheets

(56) References Cited

U.S. PATENT DOCUMENTS

| | | | |
|---|---|---|---|
| 2008/0174378 A1* | 7/2008 | Cusmai | H03B 27/00 |
| | | | 331/167 |
| 2013/0033321 A1* | 2/2013 | Lindstrand | H03F 3/2171 |
| | | | 330/253 |
| 2017/0070197 A1* | 3/2017 | Sivonen | H04B 1/1036 |
| 2017/0163224 A1* | 6/2017 | Batel | H03F 3/19 |
| 2018/0123567 A1* | 5/2018 | Hu | H03H 11/44 |

OTHER PUBLICATIONS

Chu, "Physical Limitations of Omnidirectional Antennas", Research Laboratory Of Electronics Massachusetts Institute of Technology, Technical Report No. 64, p. 1-21, May 1, 1948.

Linvill, "Transistor Negative-Impedance Converters", IEEE, Proceedings of The I.R.E. 1953, p. 725-729, Jun. 1953.

Lim et al., "A Tunable Electrically Small Antenna for Ground Wave Transmission", IEEE Transactions on Antennas and Propagation, vol. 54, No. 2, p. 417-421, DOI: 10.1109/TAP.2005.863394, Feb. 2006.

Sussman-Fort et al., "Non-Foster Impedance Matching of Electrically-Small Antennas", IEEE Transactions on Antennas and Propagation, vol. 57, No. 8, p. 2230-2241, Aug. 2009.

Moon et al., "Miniaturisation of $\lambda/4$ Microstrip Antenna Using Perturbation Effect and Plate Loading for Low-VHF-Band Applications", IEEE, Electronics Letters vol. 47 No. 3, Feb. 3, 2011.

White et al., "A Non-Foster VHF Monopole Antenna", IEEE, Antennas and Wireless Propagation Letters, vol. 11, p. 584-586, Jun. 1, 2012.

Oh et al., "Extremely Small Two-Element Monopole Antenna for HF Band Applications", IEEE Transactions On Antennas And Propagation, vol. 61, No. 6, p. 2991-2999, DOI: 10.1109/TAP.2013.2249034, Jun. 2013.

Choi et al., "Electrically Small Folded Dipole Antenna for HF and Low-VHF Bands", IEEE Antennas and Wireless Propagation Letters, vol. 15, p. 718-721, DOI : 10.1109/LAWP.2015.2470215, Mar. 9, 2016.

Choi et al., "Low-Power Low-VHF Ad-Hoc Networking in Complex Environments", IEEE Access: Multidisciplinary: Rapid Review, Open Access Journals, vol. 5, p. 24120-24127, DOI: 10.1109/ACCESS.2017.2771342, Nov. 28, 2017.

Choi et al., "A Non-Foster Matched Dipole for A Low-VHF Mobile Transmitter System", IEEE, AP-S, p. 2357-2358, 2017.

Shih et al., "Wideband, Non-Foster Impedance Matching of Electrically Small Transmitting Antennas", IEEE Transactions on Antennas and Propagation, vol. 66, No. 11, p. 5687-5697, DOI: 10.1109/TAP.2018.2863123, Nov. 2018.

\* cited by examiner

| | Baseline Antenna | Proposed Approach | With Ideal Non-Foster Reactances | $\lambda_0/8$ Dipole |
|---|---|---|---|---|
| $f_{peak}$ (MHz) | 40.1 | 40.2 | 39.7 | 40.1 |
| 3 dB BW (%) | 0.87 | 3.04 | 5.69 | 2.87 |

TABLE I
BANDWIDTH COMPARISON FOR SEVERAL ANTENNAS

FIG. 10

ACTIVE MATCHING NETWORK DESIGN FOR ELECTRICALLY SMALL RESONANT ANTENNAS

RELATED APPLICATION

This application claims benefit to U.S. Provisional Patent Application Ser. No. 62/873,240 filed Jul. 12, 2019 entitled "Active Matching Network For An Electrically Small Resonant Antenna," which is hereby incorporated herein in its entirety.

GOVERNMENT INTEREST

The invention described herein may be manufactured, used and licensed by or for the U.S. Government.

BACKGROUND

Field

Embodiments of the present invention generally relate to miniature resonant antennas and, more specifically, to active matching networks for miniature resonant antennas.

Description of the Related Art

Antenna size and performance affect design of wireless mobile communication systems pertaining to compactness, operating power, and system bandwidth. For systems operating in long wavelength bands such as High Frequency (HF) and Very High Frequency (VHF), antenna miniaturization is generally desirable to reduce communication system size and weight. By miniature (being electrically small), it is meant that the antenna has a physical length that is substantially less than the antenna's resonant wavelength, i.e., on the order of $\lambda/10$, where $\lambda$ is the resonant wavelength of the antenna. Recent advances in miniaturized passive antennas enable compact, efficient wireless mobile communications in the HF and VHF bands. Some of these designs are approaching the fundamental performance limit on electrically small passive antennas, defined as the product of radiation efficiency and fractional bandwidth. This indicates that further progress in gain and bandwidth with small form-factor passive designs is unlikely. Additionally, the bandwidth of a miniature passive antenna is very narrow such that using such an antenna limits the amount of information that can be sent via the communication system.

Passively matched electrically small antennas have a fundamental limitation in terms of the maximum bandwidth-efficiency product which defines an upper limit. In order to increase the bandwidth electrically small antenna while maintaining their small form factor, active matching techniques have been investigated. Prior arts on active matching techniques generally utilize non-Foster matching networks comprising a cross-coupled transistor pair with a matching circuit between the pair of transistors. The network is used to broaden impedance bandwidth of an electrically small unmatched antenna by producing a negative capacitor and/or a negative inductor to cancel the reactive component of the input impedance of the unmatched antenna over a wide frequency range. Previous work on non-Foster matching networks has shown enhanced gain over a wide frequency range when the matched antenna performance is compared to the unmatched antenna performance. In one prior effort, a 15-cm monopole antenna matched with a negative capacitance circuit is shown through measurements to achieve more than 10 dB improvement in transmission efficiency over 30 to 200 MHz relative to the passive unmatched case. In another effort, simulation results showing transducer gain (transmission efficiency) between a 50-ohm source and a 15-cm monopole antenna predict a gain increase of up to 26 dB over 30 to 140 MHz, when comparing non-Foster matching with a single ideal negative capacitance to no matching. However, further improvements are needed in such non-Foster matching networks to enhance the transmission efficiency of the actively matched antenna against efficient miniature antennas operating in the same frequency band, while simultaneously broadening an antenna bandwidth.

Therefore, there is a need in the art for improved actively matched miniature antennas.

SUMMARY

Embodiments of the present invention generally include an active matching network for impedance matching to a miniature antenna, comprising a cross-coupled transistor pair, where each transistor has an emitter, base and collector, the emitter of a first transistor forms an input terminal, the emitter of a second transistor forms on output terminal, the collector of the first transistor coupled to the base of the second transistor, the collector of the second transistor coupled to the base of the first transistor, and a matching circuit coupled between the collectors of the first and second transistors. The matching network is configured to match an impendence near resonance of the high Q miniature antenna to an input impedance using a complex negative impedance comprising resistance, inductance and capacitance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention comprise an antenna matching network for providing improved bandwidth and transmission efficiency for a miniature resonant antenna, where the bandwidth and transmission efficiency are significantly improved relative to an unmatched miniature antenna. In one specific embodiment, a non-Foster, active matching network is used to more than triple a miniature antenna's 3 dB bandwidth while simultaneously providing 10 dB improvement in transmission efficiency relative to a matching network with negative capacitance and 38 dB improvement relative to an unmatched 15 cm monopole antenna within the enhanced bandwidth.

Figure 1:
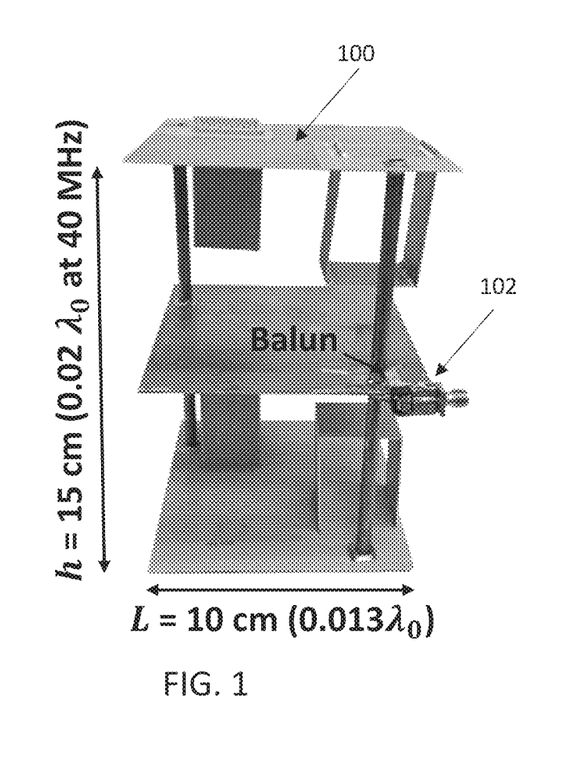
FIG. 1 is a photograph of an embodiment of a miniature, resonant antenna.

FIG. 1 depicts one embodiment of a baseline resonant antenna 100 (a folded dipole) that can be used in combination with embodiments of the active matching network. This antenna design is described in J. Choi, F. T. Dagefu, B. M. Sadler, and K. Sarabandi, "Electrically Small Folded Dipole Antenna for HF and Low-VHF Bands," *IEEE Antennas Wireless Propag. Lett.*, vol. 15, pp. 718-721, August 2015, which is hereby incorporated herein by reference in its entirety. The antenna 100 includes a balun 102 to which, as described below, the active matching network will be connected.

In one embodiment, the electrically small resonant antenna of FIG. 1 is coupled to an active matching to broaden the effective bandwidth while maintaining the high radiation efficiency to support low power applications. A key challenge with this approach stems from the fact that, due to their high Q characteristics (e.g., the Q of the baseline resonant antenna 100 is 4038 at 40 MHz), electrically small passive antenna designs have very steep impedance variation with frequency near resonance, and an impedance model that accurately captures the variation in both the real and imaginary parts of the impedance is necessary for active matching circuit design. Moreover, achieving robust stability of the matching network is very difficult to design due to the use of a resonant R-L-C circuit (i.e., a circuit having resistance (a resistive element), inductance (an inductive element) and capacitance (a capacitive element)) to design the impedance model in the matching network that is built with a negative impedance converter (NIC). Such designs can lead to an oscillation-prone configuration.

Figure 2:
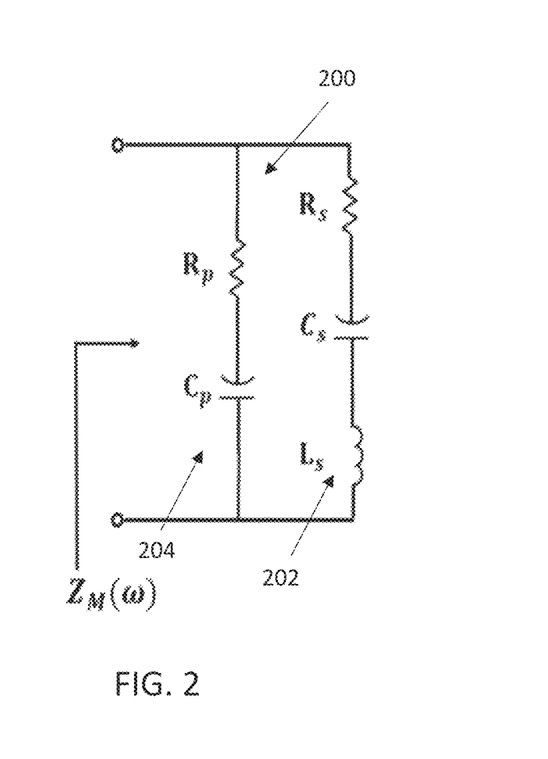
FIG. 2 depicts an impedance model for the antenna of FIG. 1.
Figure 3:
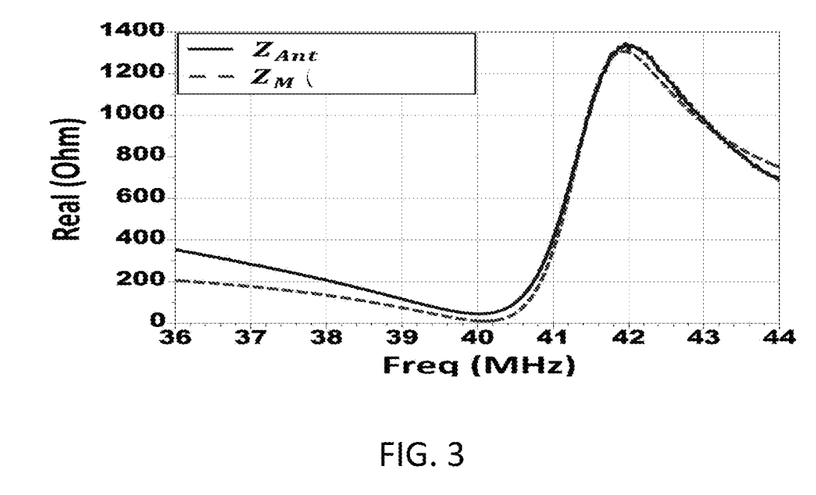
FIG. 3 is a graph of the real component of impedance for a model of a baseline miniature antenna and measured impedance of the baseline miniature antenna.
Figure 4:
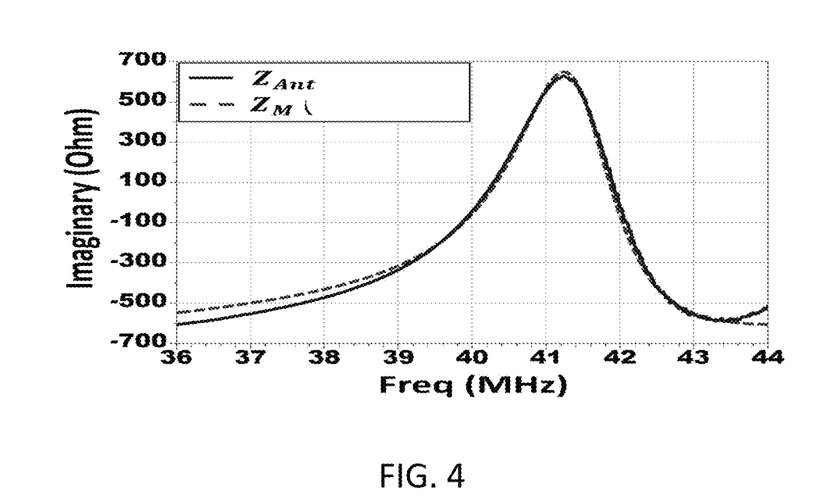
FIG. 4 is a graph of the imaginary component of impedance for a model of a baseline miniature antenna and measured impedance of the baseline miniature antenna.

FIG. 2 depicts an impedance model 200 of the antenna of FIG. 1. As will be discussed in detail below, the impedance model 200 comprises a resonant R-L-C circuit as opposed to an impedance model used in previous efforts to produce negative capacitance through a non-foster matching network. FIGS. 3 and 4 depict graphs of a comparison of the measured impedance ($Z_{Ant}$) (solid line) and modeled impedance ($Z_M$) (dashed line) response of the antenna of FIG. 1. More specifically, FIG. 3 depicts the real component of the impedance and FIG. 4 depicts the imaginary component of the impedance.

Selection of a baseline resonant antenna is application dependent. In one exemplary embodiment, the baseline resonant antenna supporting very compact, low-power applications is depicted as antenna 100 in FIG. 1. The unmatched antenna 100 is a $\lambda_0/50$ folded dipole operating at nominal 40 MHz, with 3 dB bandwidth of 0.35 MHz (or 0.87% fractional bandwidth). This antenna 100 operates very near to the optimal performance limit for passive designs at this electrical size. The gain of this antenna is −13 dBi. The measured real and imaginary parts of the impedance response of this design are respectively shown in FIGS. 3 and 4, exhibiting a sharp peak near resonance. In one embodiment, coupling this antenna to a non-Foster active matching network, as described below, enhances the bandwidth and maintains transmission efficiency, while not requiring an increase in the electrical size of the antenna.

For this particular embodiment, the baseline antenna design is selected for a low-power operation in a wireless mobile communication application. If bandwidth is critical for an application with no transmit power constraints, those skilled in the art may select other baseline designs as being more appropriate.

The extent of bandwidth enhancement via the proposed matching technique depends on an appropriate representation of the baseline antenna impedance model. By accurately modeling the antenna impedance, an active matching network can be designed to cancel the imaginary component of the antenna impedance, while maintaining the real component close to the signal source impedance (e.g., 50 ohms) near the resonant frequency.

In one embodiment, the maximum acceptable error in the impedance model is constrained to ensure that the resulting return loss over the bandwidth of interest is above 10 dB. This leads to the design goal:

$$\frac{|\Delta Z(\omega) - Z_s|}{|\Delta Z(\omega) + Z_s|} < 0.31, \tag{1}$$

where $\Delta Z(\omega) = Z_{Ant}(\omega) - Z_M(\omega)$, $Z_{Ant}(\omega)$ and $Z_M(\omega)$ are the complex impedance of the baseline resonant antenna and the corresponding impedance model as a function of angular frequency $\omega$, respectively, and $Z_s$ is the signal-source impedance.

Various circuit topologies were considered to model the impedance. Ultimately, a form of the modified Butterworth Van-Dyke model was selected. This model was selected because it captures the reactance variation as a function of frequency near the resonance of the antenna. This particular circuit topology can accommodate the best fit as the series and parallel resonance are close to each other. The resulting five element R-L-C circuit model 200 is shown in FIG. 2, which is relatively simple but, as described below, enables the matching network to achieve the design constraint in Equation (1). The model 200 is given by $$Z_M(\omega) = \left(R_s + j\omega L_s + \frac{1}{j\omega C_s}\right) \| \left(R_p + \frac{1}{j\omega C_p}\right). \tag{2}$$

This two-branch parallel circuit of the model 200 enables modeling of the series and parallel resonant frequencies shown in the measured antenna impedance of FIGS. 3 and 4. Specifically, $R_s$, $L_s$, and $C_s$ are connected in series forming a first branch 202, $R_p$ and $C_p$ are connected in series forming a second branch 204, and the first and second branches 202 and 204 are connected in parallel to form the model 200. The $R_s$-$L_s$-$C_s$ branch 202 determines the series resonance and the $R_p$-$C_p$ branch 204 regulates parallel resonance at higher frequencies.

The initial model design was optimized using a circuit simulator (Keysight ADS available at www.keysight.com) to determine parameter values of the impedance model. The optimization proceeds with least-squares error-function formulation that measures the difference between the simulation and the design goal of Equation (1). Starting from an initial set of parameter values of the impedance model within a given range, the simulation is iteratively continued until the error function approaches zero. The final model parameters are $C_p$=6.34 pF, $R_p$=374Ω, $R_s$=10Ω, $L_s$=37.45 µH, $C_s$=0.42 pF. FIGS. 3 and 4 respectively illustrate the real and imaginary parts of the designed $Z_M(\omega)$ along with the measured antenna impedance, satisfying the design goal (1) around the resonant frequency. Note that high $L_s$ is required for the series resonance for a given $R_s$ because the higher the inductance and the lower the capacitance, the steeper the impedance variation.

Figure 5:
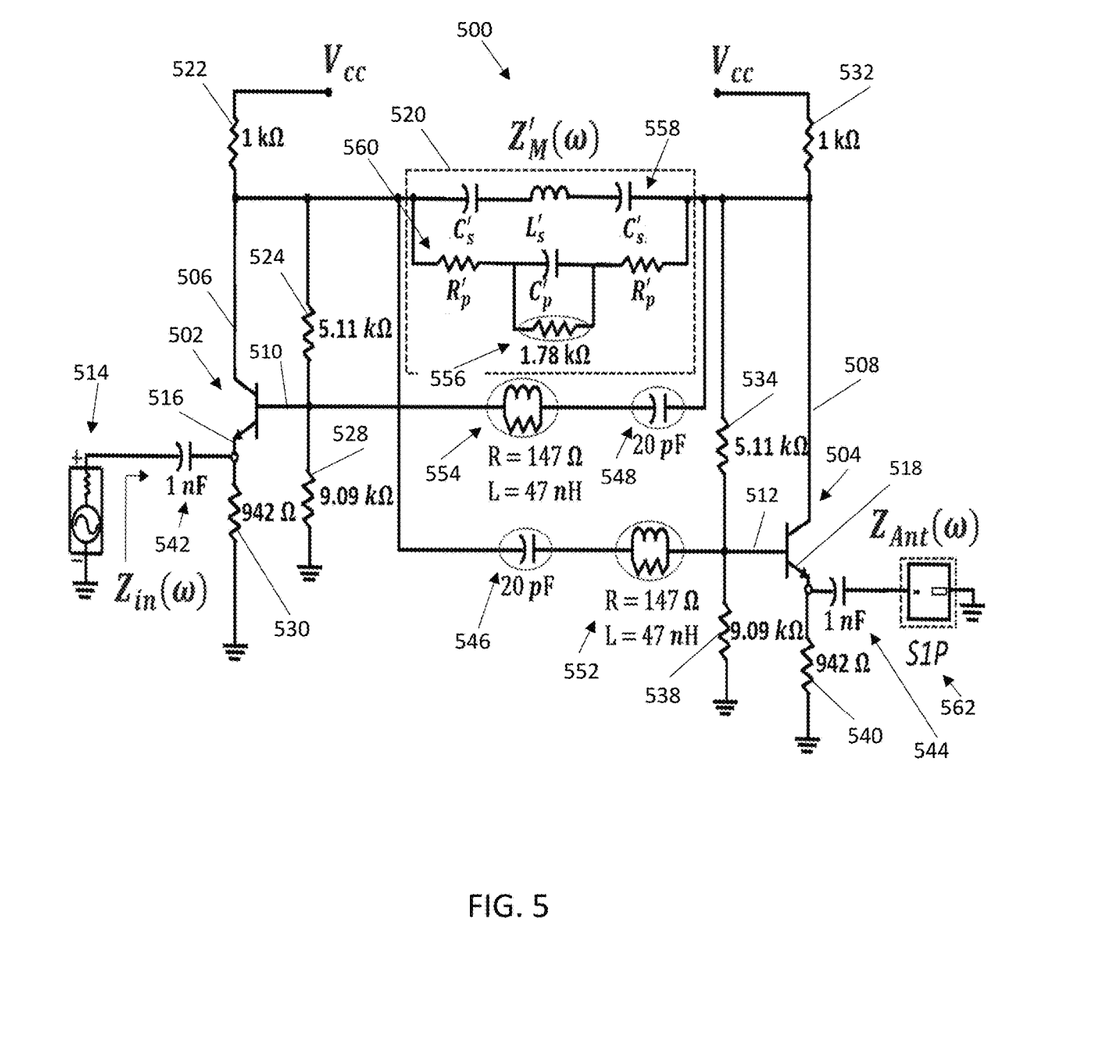
FIG. 5 is a schematic diagram of an active matching network in accordance with one embodiment of the invention.

From the impedance model 200, an active matching network was derived. FIG. 5 depicts one embodiment of the invention, an active matching network 500 comprising a cross-coupled transistor pair 502 and 504, where the collector 506, 508 of each bipolar junction transistor (BJT) 502, 504 is connected to the base 510, 512 of the other transistor 502, 504. A signal input terminal 514 is coupled to the emitter 516 of transistor 502 and an output terminal 562 is connected the emitter 518 of transistor 504. The signal input terminal 514 may be coupled to a signal source (e.g., transmitter). The output terminal 562 is typically connected to an antenna such as baseline miniature antenna 100 (via its balun 102). The active matching network 500 further comprises a matching circuit 520 coupled between the collectors 506 and 508 of transistors 502 and 504. Resistors 522, 524, 528, 530, 532, 534, 538 and 540 form well-known bias circuits of the transistors 502 and 504. Capacitors 542 and 544, respectively, are input and output coupling capacitors.

To form the cross coupled feedback, the collector 526 of transistor 502 is connected through feedback capacitor 546 to the base 512 of transistor 504. Similarly, the collector 536 of transistor 504 is connected through feedback capacitor 548 to the base 510 of transistor 502. Parallel inductor-resistor pairs 550 and 552 are included in the feedback path to ensure stability, as shall be described below.

The matching circuit 520 is analogous to the antenna impedance model and is designed to cancel the imaginary component of the antenna impedance while maintaining the real component close to the impedance of a signal source coupled to input terminal 514. As such, the matching circuit 520 comprises a first branch 558 connected in parallel with a second branch 560. The first branch 558 comprises serially connected $L'_s$ and $C'_s$ (inductive and capacitive elements) and the second branch 560 comprises a serially connected $R'_p$ and $C'_p$ (resistive and capacitive elements) plus a resistor 556 (a resistive element) connected in parallel with capacitor $C'_p$. The values of the components are as follows: $L'_s$=$L_s$, $C'_s$=$2C_s$, $$R'_p = \frac{R_p}{2},$$

$C'_p$=$C_p$ and resistor 556 is 1.78Ω. Depending upon the impedance of the antenna, the values of the components and number of components comprising the inductive, resistive, and capacitive elements of the matching circuit may vary. From the description herein, those skilled in the art shall be able to determine and optimize the matching network to facilitate impedance matching to a miniature antenna.

For accurate design and evaluation of the matching network 500, an iterative approach was used via simulations and measurements that captures parasitics resulting from the use of non-ideal components and BJTs. To prevent potential oscillations, rigorous analysis of the overall system stability is performed using ADS.

To understand how to achieve system stability, first consider oscillation conditions of a basic positive feedback circuit in which an output voltage signal is fed back to its input forming a closed loop. The closed-loop voltage gain $A_{vf}(\omega)$ is given by $$A_{vf}(\omega) = \frac{V_{out}}{V_{in}} = \frac{A_v(\omega)}{1 - \beta(\omega) \cdot A_v(\omega)}, \quad (3)$$

where $A_v(\omega)$ is the open-loop gain and $\beta(\omega)$ is the transfer function of the feedback network. The Barkhausen criterion provides necessary conditions for oscillations of the feedback circuit. To avoid oscillation the loop gain $\beta(\omega) \cdot A_v(\omega)$ must satisfy $|\beta(\omega) \cdot A_v(\omega)| < 1$ or $\angle \beta(\omega) \cdot A_v(\omega)) \neq 0°$.

The matching network 500 of FIG. 5 is designed to meet the foregoing stability condition. A simulation-based loop-gain analysis was performed using a device OscTest in ADS with measured antenna impedance data (one-port S-parameter file). Models of low-noise NPN bipolar RF transistors (for example, Infineon BFR93A) provided by the manufacturer are used in the design of the cross-coupled pair. An important aspect of the design procedure is performing electromagnetic-circuit co-simulation to capture the effects of circuit traces and the dielectric substrate that can significantly affect $Z_M(\omega)$. Co-simulation allows for these effects to be accurately taken into account and compensated for in the design. In order to achieve optimal matching performance under the stability conditions, the aforementioned optimization process is then performed by setting a design goal of an input reflection coefficient of the overall matching network below −10 dB near resonance.

The matching network 500 is fully symmetric so that the cross-coupled pair of transistors 502 and 504 are in equilibrium. In addition, considering that component characteristics are a limiting factor of matching performance and parasitic elements of non-ideal (actual) components whose effects are prominent with increasing operating frequency, the component values for the impedance model are adjusted accordingly. Model parameters within the matching circuit 520 representing multiple inductors in series are utilized for $L'_s$ to have higher Q factor and higher self-resonant frequency to be far away from the antenna resonant frequency that strongly affect the design accuracy of the matching circuit 520. The resistor $R_s$ in FIG. 2 is removed from the matching circuit 520 to account for the actual inductor characteristics. Note that parasitics from the non-ideal components would cause the system to be unstable resulting from spurious oscillations and/or reduce a degree of bandwidth enhancement. This issue is addressed by introducing additional components in the overall circuit; these are highlighted with circles in FIG. 5—capacitors 546 and 548, inductor-resistor pairs 552 and 554 and resistor 556. Specifically, the loop gain function is controlled by adjusting the values of the feedback capacitors 546 and 548 and adding a resistor 556 in parallel with $C'_p$ in $Z'_M(\omega)$ to satisfy the stability condition. Also, parallel inductor-resistor (147 Ω∥47 nH) 552 and 554 are connected in series with each of the feedback capacitors 546 and 548 along each cross-coupled path to prevent oscillation at high frequencies (>>operating range of interest).

Figure 6:
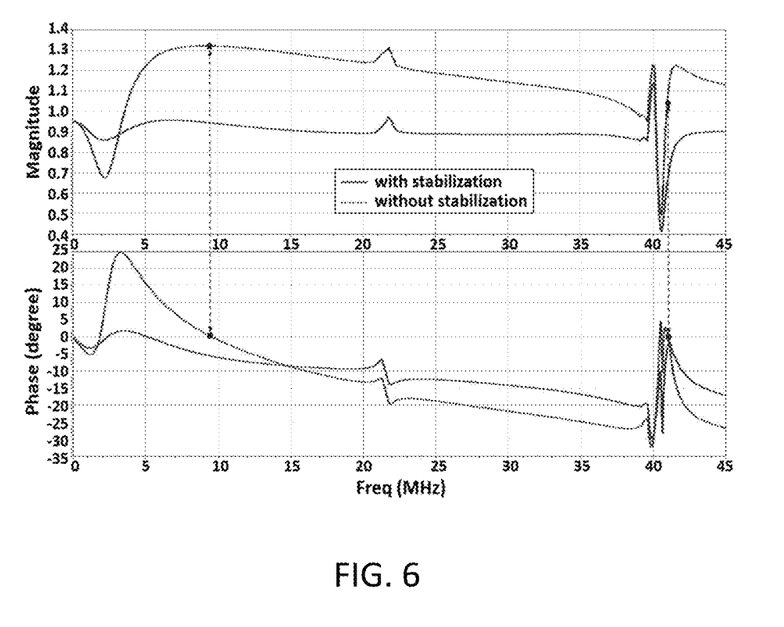
FIG. 6 is a graph of simulated small signal loop gain for the active matching network of FIG. 5.

FIG. 6 is a graph of simulation results of the small-signal loop-gain for the matching network of FIG. 5. With stabilization (solid line), the magnitude of the loop gain is smaller than unity or the phase is non-zero, which ensures no circuit oscillations. The simulation was performed up to 1 GHz but for clarity only plotted up to 45 MHz. Note the unstable points denoted with a vertical dotted line, and their resolution in the final stabilized design. The modifications made to stabilize the system also affect the degree of bandwidth enhancement. As stated above, the matching circuit 520 was developed using an iterative simulation approach, which involves both the optimization process determining parameter values of $Z'_M(\omega)$ and loop-gain analysis, to increase the bandwidth as much as possible without causing oscillations.

A large-signal S-parameter simulation was conducted based on a harmonic balance simulation to investigate nonlinear effects of the active circuit on the matching performance with respect to large AC signals and variations in power supply values. This helps to determine the stable operating range of input power levels and DC bias values. Simulation and measurement results of large-signal analysis, along with performance evaluation of the system, are described in the next section.

Based on the design described above, an active matching network 500 was fabricated and characterized. Important fabrication issues are addressed as follows. Trimmer capacitors, with tuning range 0.45 pF to 4 pF are used to enable fine-tuning of $Z'_M(\omega)$ in the matching circuit 520, allowing for small impedance variations of the antenna arising from proximity effects in the measurement environment as well as component and fabrication tolerances. To mitigate small reactance variations resulting from an SMA adapter and associated transmission line, the matching circuit is directly connected to the antenna Balun (depicted at 102 in FIG. 1). The circuit 500 is also positioned along the null plane bisecting the antenna structure to minimize the effects of the circuit on the baseline antenna characteristics including input impedance and radiation pattern. Multiple ferrite beads are used on the DC power line for high frequency noise and parasitic suppression, and they are also utilized on the coaxial feed cable to suppress common mode current flowing on the outer conductor of the cable.

Figure 7:
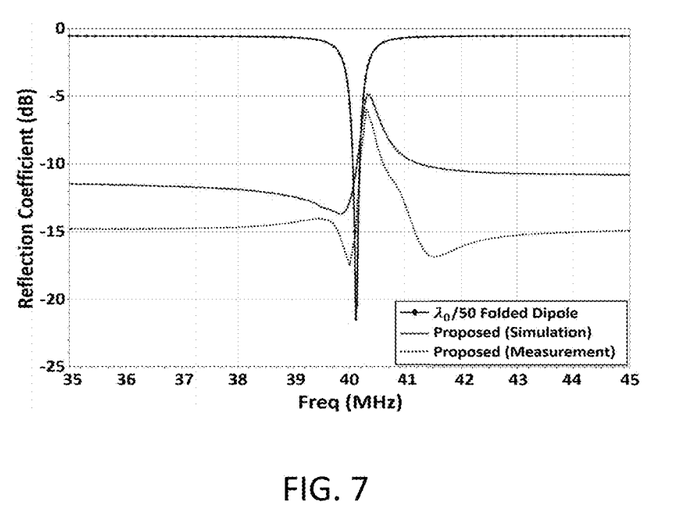
FIG. 7 is a graph of simulated and measured reflection coefficients for the active matching network of FIG. 5 when coupled to the baseline miniature antenna of FIG. 1 as well as the reflection coefficient of the baseline miniature antenna without the matching network (passive antenna)

Impedance matching performance of the fabricated actively matched antenna (antenna 100 in combination with active matching network 500) was characterized using a calibrated vector network analyzer. Before the characterization, a stability check of the overall system was performed using a spectrum analyzer and a high frequency oscilloscope to confirm that no spurious oscillations occur when DC bias is applied to the matching circuit. Large-signal measurements as a function of AC input signal level and DC bias were performed to examine nonlinear circuit behaviors that may directly affect the matching performance. FIG. 7 depicts a graph of measured reflection coefficients and circuit simulation results, when $V_{CC}$ (see FIG. 5) is 6 V at 4 mA and the input power is fixed at −3 dBm. The reflection coefficient of the baseline passive antenna is also plotted for comparison. Note that the impedance matching is very difficult at the frequencies where the impedance of the baseline antenna changes sharply (see FIGS. 3 and 4) due to practical limits of the matching circuit design as stated above. Also, a discrepancy between measurement and simulation is introduced by the actual component and fabrication tolerances.

In order to characterize radiation performance of the actively matched antenna with respect to the matching performance, relative transmission efficiency is measured in a line-of-sight scenario. Three different antennas were used for transmission (an embodiment of the proposed antenna (antenna and matching network), an embodiment of the baseline antenna (antenna alone), and a short monopole as a reference antenna). The short monopole is 15 cm in height, with a diameter of 5 mm, mounted over a ground plane whose dimension is 0.9 m×0.9 m. The antennas were fed through an RF signal generator that produced a tone with a step size of 1 kHz at a specified power. A DC power supply was used to power the matching network 500. A receiver consisted of a length $\lambda_0/6$ dipole at 40 MHz feeding a spectrum analyzer. Here, for measurement purposes, the receiving antenna bandwidth was large enough to cover that of the actively matched antenna. The received power level was recorded to calculate relative transmission efficiency by employing a max hold function in the spectrum analyzer.

Figure 8:
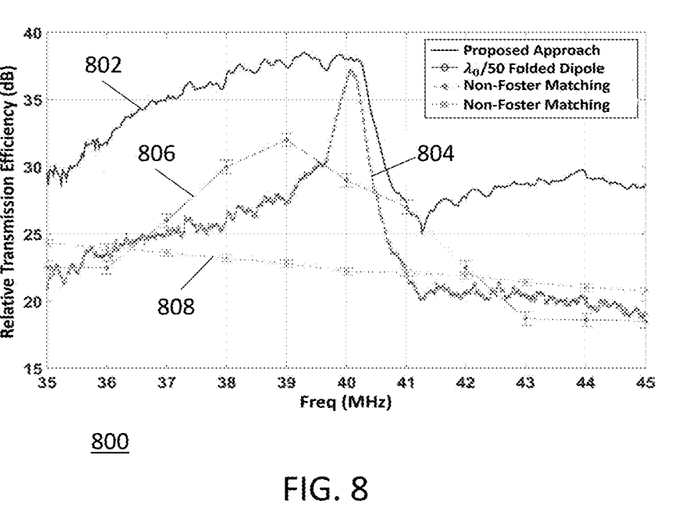
FIG. 8 is a graph of transmission efficiency for the active matching network relative to a 15 cm monopole based on measured transfer function and, for comparison purposes, the graph includes the transmission efficiency of a baseline antenna without a matching circuit and two non-foster matching networks with negative capacitance of the background art used to match the 15 cm monopole antenna.

FIG. 8 depicts a graph 800 of the calculated transmission efficiency of the proposed actively matched antenna 802 and the baseline passive antenna (FIG. 1) without a matching network 804 relative to the 15 cm monopole. In this way, the advantage of using the proposed approach with respect to transmit (Tx) power can be estimated by comparing graphs 802 and 804 with graphs 806 and 808 transmission efficiency of other non-Foster matching techniques with negative capacitance applied to the 15-cm monopole. As shown in FIG. 8, comparing graph 802 produced by an embodiment of the invention with previous active antenna designs (graphs 806 and 808), the embodiment of the invention is much more efficient in the target frequency range, e.g., requiring more than 10 times less power.

Impedance matching performance of the proposed antenna is dependent on both the DC bias and Tx power level. When the input AC signal is small compared to the DC bias, the cross-coupled pair properly functions as a negative impedance converter (NIC) in the small-signal regime where balanced operation of the BJTs in the pair is maintained. In other words, a proper active matching can be performed over a limited portion of the DC bias range for a given input AC signal.

The characteristics of the antenna-matching network combination are different from that of typical wideband passive antennas where both the impedance and gain do not change significantly over the bandwidth. When using active matching with a resonant antenna, peak power radiated from the antenna occurs at resonance and the decrement in power away from the resonance is determined by the radiation efficiency of the baseline antenna and the impedance matching improvement. At any given frequency, the total efficiency is equal to the product of the radiation efficiency and the impedance mismatch loss.

The transmission efficiency is increased with increasing DC bias levels for a given input AC signal. This is due to the incremental amount of negative resistance produced by the NIC acting as an amplifier that increases the input AC signal delivered to the active antenna. Further increase in the DC bias, however, gives rise to matching degradation and potential oscillations of the system. A similar behavior was also observed by sweeping the input AC signal while keeping a fixed DC bias. Thus, the maximal bandwidth of the matching network under stable operating conditions can be determined with a proper DC bias for a given input power.

Because the actively matched antenna requires a DC power supply to operate the matching network, the overall system power efficiency is considered to evaluate the effectiveness of the proposed approach against the baseline passive design when used for wireless transmission applications. A power efficiency factor $\eta_f$ is defined for a Tx system with the actively matched antenna, relative to the same system with the baseline passive design, as $$\eta_f = \frac{|T_A(\omega)|^2}{|T_P(\omega)|^2} \cdot \frac{P_{DC(P)}}{P_{DC(A)}}. \qquad (4)$$

Here, $T_A(\omega)$ and $T_P(\omega)$ are the measured transmission efficiency with the active and passive antennas, respectively, in the test system. $P_{D\,(P)}$ is the DC power for transmission in the passive case, and for the active case $P_{DC(A)}$ is the DC power for transmission plus the power for the matching network. Thus, $\eta_f$ is a figure of merit that takes into account the additional DC power for the active matching circuit and the resulting performance enhancement. For example, assuming that both the active and passive antennas are used for transmission in a low-power radio system that operates at 3.3 V/240 mA. When $P_{DC}$ for the matching circuit is chosen to be 6 V/4 mA, the active matching enhances the effective 3 dB bandwidth from 0.87% to 3.04% resulting in $\eta_f > 1$, so that the overall system with the active antenna is more power-efficient despite the added DC power needed to operate the matching circuit. In fact, for most compact low-frequency radio systems, this is pertinent because they typically operate with higher DC power.

Figure 9:
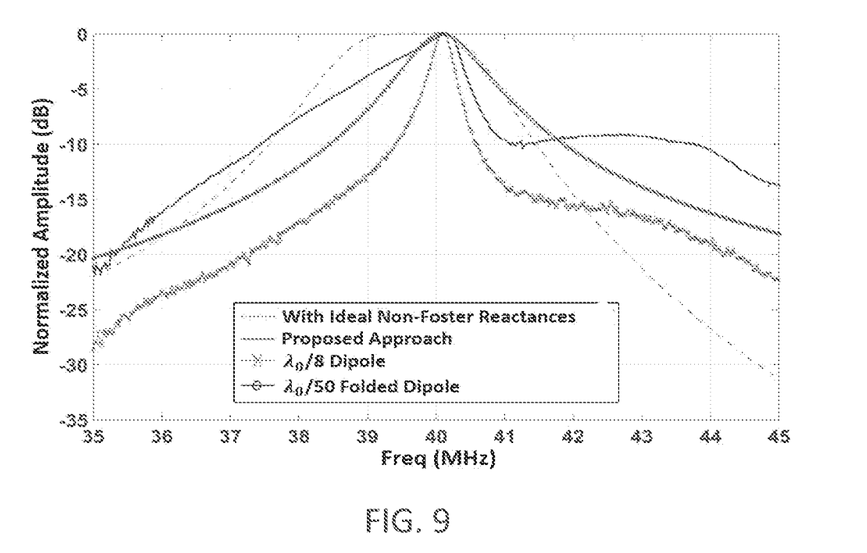
FIG. 9 is a graph of measured transfer function for various antennas.
Figure 10:
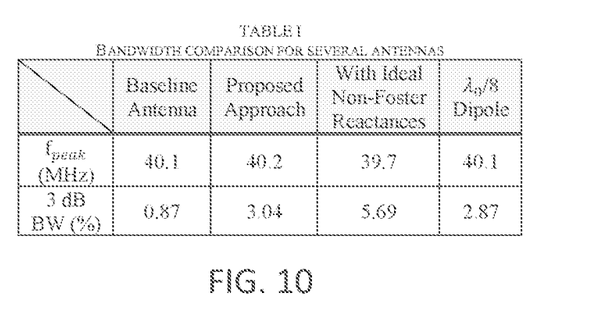
FIG. 10 presents TABLE 1 that contains bandwidth values for various antennas.

Another intriguing point with regard to bandwidth is illustrated in FIG. 9 and tabulated in Table I. Because the antenna and matching network that forms an embodiment of the present invention provides an effective 3 dB bandwidth which is comparable to that of a miniature passive dipole having a length of $\lambda_0/8$ at 40 MHz, a more compact wireless transmission system with 84% size reduction can be designed with the proposed approach relative to using the $\lambda_0/8$ dipole. Using a well-known simulation method, impedance matching with ideal lossless non-Foster reactances and a transformer applied to a two-port antenna model of the baseline passive antenna is also plotted. This provides an upper bound on bandwidth enhancement for the baseline design.

While the foregoing is directed to embodiments of the present invention, other and further embodiments of the invention may be devised without departing from the basic scope thereof, and the scope thereof is determined by the claims that follow.

The invention claimed is:

1. An active matching network comprising:
a cross-coupled transistor pair, where each transistor has an emitter, base and collector, the emitter of a first transistor forms an input terminal, the emitter of a second transistor forms on output terminal, the collector of the first transistor coupled to the base of the second transistor, the collector of the second transistor coupled to the base of the first transistor; and
a matching circuit, coupled between the collectors of the first and second transistors, wherein the matching circuit comprises a first branch and a second branch, where the first branch is coupled in parallel with the second branch and comprises a capacitance and an inductance and the second branch comprises at least one resistive element connected in series with at least one capacitive element.

2. The active matching network of claim 1 further comprising a resistive element connected in parallel with the capacitive element of the second branch.

3. The active matching network of claim 1 has an impedance configured to cancel an imaginary component of an antenna impedance while maintaining the real component of the impedance near an impedance of a signal source to be connected to the active matching network.

4. The active matching network of claim 3 where a value of each of the inductive, capacitive and resistive elements establishes the impedance.

5. The active matching network of claim 1 wherein the matching network is adapted to impedance match to a miniature antenna having a resonant wavelength ($\lambda$), where the miniature antenna has a length of less than $\lambda/10$.

6. The active matching network of claim 5 wherein the length is $\lambda/50$.

7. Apparatus for transmitting radio-frequency signals comprising:
a miniature antenna having a length that is smaller than a resonant wavelength ($\lambda$) of the antenna; and
an active matching network comprising:
a cross-coupled transistor pair, where each transistor has an emitter, base and collector, the emitter of a first transistor forms an input terminal, the emitter of a second transistor forms on output terminal, the collector of the first transistor coupled to the base of the second transistor, the collector of the second transistor coupled to the base of the first transistor; and
a matching circuit, coupled between the collectors of the first and second transistors, wherein the matching circuit comprises a first branch and a second branch, where the first branch is coupled in parallel with the second branch and comprises a capacitance and an inductance and the second branch comprises at least one resistive element connected in series with at least one capacitive element.

8. The apparatus of claim 7 further comprising a resistive element connected in parallel with the capacitive element of the second branch.

9. The apparatus of claim 7 has an impedance configured to cancel an imaginary component of an antenna impedance while maintaining the real component of the impedance near an impedance of a signal source to be connected to the active matching network.

10. The apparatus of claim 7 where a value of each of the inductive, capacitive and resistive elements establishes the impedance.

11. The apparatus of claim 7 wherein the matching network is adapted to impedance match to the miniature antenna having a resonant wavelength (A), where the miniature antenna has a length of less than 2/10.

12. The apparatus of claim 11 wherein the length is $\lambda/50$.

* * * * *